United States Patent
Sbrizzi et al.

(10) Patent No.: US 10,571,542 B2
(45) Date of Patent: Feb. 25, 2020

(54) TIME-DOMAIN MRI

(71) Applicant: UMC UTRECHT HOLDING B.V., Utrecht (NL)

(72) Inventors: Alessandro Sbrizzi, Utrecht (NL); Cornelis Antonius Theodorus Van Den Berg, Utrecht (NL); Annette Van Der Toorn, Utrecht (NL)

(73) Assignee: UMC UTRECHT HOLDING B.V., Utrecht (NL)

( * ) Notice: Subject to any disclaimer, the term of this patent is extended or adjusted under 35 U.S.C. 154(b) by 248 days.

(21) Appl. No.: 15/573,599

(22) PCT Filed: May 12, 2016

(86) PCT No.: PCT/EP2016/060727
§ 371 (c)(1),
(2) Date: Nov. 13, 2017

(87) PCT Pub. No.: WO2016/184779
PCT Pub. Date: Nov. 24, 2016

(65) Prior Publication Data
US 2018/0149722 A1    May 31, 2018

(30) Foreign Application Priority Data

May 15, 2015 (EP) .................................... 15001457
May 15, 2015 (EP) .................................... 15020075
Jun. 11, 2015 (EP) .................................... 15171708

(51) Int. Cl.
*G01R 33/50* (2006.01)
*G01R 33/24* (2006.01)
*G01R 33/561* (2006.01)

(52) U.S. Cl.
CPC ........... *G01R 33/50* (2013.01); *G01R 33/243* (2013.01); *G01R 33/246* (2013.01);
(Continued)

(58) Field of Classification Search
CPC ........ G01R 33/00; G01R 33/20; G01R 33/24; G01R 33/243; G01R 33/246; G01R 33/44;
(Continued)

(56) References Cited

U.S. PATENT DOCUMENTS 8,421,456 B2    4/2013   Yang et al.
10,321,845 B2*  6/2019   Amthor .................. A61B 5/055
(Continued)

FOREIGN PATENT DOCUMENTS

CN    101006356 A    7/2007
CN    101484823 A    7/2009

OTHER PUBLICATIONS

Knopp T et al: "Iterative Off-Resonance and Signal Decay Estimation and Correction for Multi-Echo MRI", IEEE Transactions on Medical Imaging, IEEE Service Center, Piscataway, NJ, US, vol. 28, No. 3, Mar. 1, 2009 (Mar. 1, 2009), pp. 394-404, XP011248349, ISSN: 0278-0062.
(Continued)

*Primary Examiner* — Hoai-An D. Nguyen
(74) *Attorney, Agent, or Firm* — Young & Thompson (57) ABSTRACT

A system for performing time-domain magnetic resonance imaging includes an excitation device for transiently exciting a sample thereby causing the sample to emit an MRI signal. A receiving coil receives the MRI signal. A simulated signal of the receiving coil is generated in a time domain, based on a plurality of spatial parameter distributions, wherein the spatial parameter distributions include a spatial distribution of a magnetization, wherein the spatial parameter distributions further include at least one of a spatial distribution of a material property of a material of the sample and a spatial distribution of an electromagnetic field. An objective function is based on a difference between the
(Continued)

received MRI signal and the simulated signal in the time domain. The plurality of spatial parameter distributions are fitted based on the objective function. The sample is excited again before the sample reaches an equilibrium state.

14 Claims, 3 Drawing Sheets

(52) U.S. Cl.
CPC ........ *G01R 33/561* (2013.01); *G01R 33/5613* (2013.01); *G01R 33/5614* (2013.01)

(58) Field of Classification Search
CPC ........ G01R 33/48; G01R 33/50; G01R 33/54; G01R 33/56; G01R 33/561; G01R 33/5613; G01R 33/5614
USPC ........................................ 324/300, 307, 309
See application file for complete search history.

(56) References Cited

U.S. PATENT DOCUMENTS

| | | | |
|---|---|---|---|
| 2009/0227860 | A1 | 9/2009 | Dahnke et al. |
| 2009/0276187 | A1* | 11/2009 | Martin ............... G01N 24/08 702/189 |
| 2009/0292197 | A1 | 11/2009 | Fuderer |
| 2009/0322331 | A1* | 12/2009 | Buracas ............ A61B 5/0263 324/309 |
| 2012/0081112 | A1* | 4/2012 | Deimling ........... G01R 33/5614 324/309 |
| 2017/0090000 | A1* | 3/2017 | Lin .................... G01R 33/3607 |
| 2018/0038928 | A1* | 2/2018 | Wiesinger ............. G01R 33/50 |

OTHER PUBLICATIONS

Bradley P Sutton et al: "Simultaneous estimation of I,, Rz*, and field map using a multi-echo spiral acquisition", Proceedings of the International Society for Magnetic Resonance in Medicine, 10th Annual Meeting and Exhibition, Honolulu, Hawaii, USA, May 18-24, 2002, vol. 10, May 4, 2002 (May 4, 2002), pp. 1323, XP055207007.
Donald B Twieg et al: "Basic Properties of SS-Parse Parameter Estimates", IEEE Transactions on Medical Imaging, IEEE Service Center, Piscataway, NJ, US, vol. 29, No. 5, May 1, 2010 (May 1, 2010), pp. 1156-1172, XP011305215, ISSN: 0278-0062.
Cloos Martijn A. et al: "Plug and play parallel transmission at 7 and 9.4 Tesla based on principles from MR fingerprinting", Proceedings of the International Society for Magnetic Resonance in Medicine, 22nd Annual Meeting and Exhibition, Milan, Italy, May 10-16, 2014, vol. 22, No. 542, Apr. 25, 2014 (Apr. 25, 2014), XP040661622.
Dan Ma et al: "MR Fingerprinting (MRF): a Novel Quantitative Approach to MRI", Proceedings of the International Society for Magnetic Resonance in Medicine, 20th Annual Meeting and Exhibition, Melbourne, Australia, May 5-11, 2012, vol. 20, Apr. 21, 2012 (Apr. 21, 2012), pp. 288, XP055207010.
Noam Ben-Eliezer et al: "Rapid and accurate T 2 mapping from multi-spin-echo data using Bloch-simulation-based reconstruction", Magnetic Resonance in Medicine, vol. 73, No. 2, Mar. 19, 2014 (Mar. 19, 2014), pp. 809-817, XP055207015, ISSN: 0740-3194, DOI: 10.1002/mrm.25156.
Krishna S. Nayak et al: "Spiral balanced steady-state free precession cardiac imaging", Magnetic Resonance in Medicine., vol. 53, No. 6, May 19, 2005 (May 19, 2005), US, pp. 1468-1473, XP055286499, ISSN: 0740-3194, DOI: 10.1002/mrm.20489.
Brian Hargreaves: "Rapid gradient-echo imaging", Journal of Magnetic Resonance Imaging, vol. 36, No. 6, Oct. 23, 2012 (Oct. 23, 2012), US, pp. 1300-1313, XP055286500, ISSN: 1053-1807, DOI: 10.1002/mri.23742.
International Search Report, dated Aug. 31, 2016, from corresponding PCT/EP2016/060727 application.
Chinese Office Action (CN OA), dated Nov. 4, 2019, from corresponding Chinese application No. CN201680035391.8, with English language translation.
Chinese Search Report (CN SR), dated Oct. 28, 2019 , from corresponding Chinese application No. CN201680035391.8, with English language translation.

* cited by examiner

TIME-DOMAIN MRI

FIELD OF THE INVENTION

The invention relates to time-domain magnetic resonance imaging.

BACKGROUND OF THE INVENTION

Magnetic resonance imaging (MRI) is an imaging modality used for many applications and with many sequence parameters that can be tuned and many imaging parameters that can be observed to extract e.g. different kinds of biological information.

Conventional MRI image reconstruction makes use of inverse fast Fourier transform (FFT) and k-space data with Cartesian sampling. For non-Cartesian sampling, the gridding method can be applied as a preprocessing step.

U.S. Pat. No. 8,421,456 discloses a method of time-domain magnetic resonance imaging and device thereof. The method includes transiently exciting a sample; receiving a signal emitted from the sample; and processing the received signal without Fourier transformation to acquire an image. The device includes an excitation device, a detecting coil and an operating circuit to process a received emitting signal and generate an image, wherein the received emitting signal is a time-domain signal free from Fourier transformation.

Donald B Twieg et al.: "Basic Properties of SS-PARSE Parameter Estimates", IEEE TRANSACTIONS ON MEDICAL IMAGING, vol. 29, no. 5, 1 May 2010, pages 1156-1172, discloses a method to obtain quantitative parameter maps from a single-shot (typically 65 ms) magnetic resonance imaging (MRI) signal.

Knopp T et al.: "Iterative Off-Resonance and Signal Decay Estimation and Correction for Multi-Echo MRI", IEEE TRANSACTIONS ON MEDICAL IMAGING, vol. 28, no. 3, 1 Mar. 2009, pages 394-404, discloses a gridding-based algorithm for off-resonance correction, extended to also address signal decay.

Bradley P Sutton et al.: "Simultaneous estimation of $I_0$ $R_2$*, and field map using a multi-echo spiral acquisition", Proceedings of the International Society for Magnetic Resonance in Medicine, vol. 10, 4 May 2002, page 1323, discloses an iterative simultaneous estimation of the field map, $R_2$*, and $I_0$.

However, there is a need for improvement of time-domain magnetic resonance imaging.

SUMMARY OF THE INVENTION

An aspect of the invention is to provide a solution for the above-identified problem. Other aspects and advantages will be apparent from the description below.

According to a first aspect, the invention provides a system for performing time-domain magnetic resonance imaging. The system comprises a radio frequency, RF, excitation device for transiently exciting a sample thereby causing the sample to emit an MRI signal, wherein the excitation device is configured to perform a sequence of excitations wherein the sample is excited again before the sample can reach an equilibrium state;

a receiving coil for receiving the MRI signal; and a processor configured to:

generate a simulated signal of the receiving coil in a time domain, based on a plurality of spatial parameter distributions, wherein the spatial parameter distributions include a spatial distribution of a magnetization, wherein the spatial parameter distributions further include at least one of a spatial distribution of a material property of a material of the sample and a spatial distribution of an electromagnetic field;

determine an objective function based on a difference between the received MRI signal and the simulated signal in the time domain; and fit the plurality of spatial parameter distributions based on the objective function.

By fitting the spatial distribution of the magnetization and at least one of a spatial distribution of a material property of a material of the sample and a spatial distribution of an electromagnetic field, the simulated signal may more accurately correspond to the measured signal providing a better fit. Moreover, the fitting results in the values of the fitted parameter distributions, which provide valuable information about the sample.

The material property may comprise a property of a tissue of an organism. This is useful for e.g. medical applications.

The material property may include a relaxation time. The spatial distribution of a relaxation time of the sample provides important information and/or may help to fit the plurality of spatial parameter distributions. The distribution of the relaxation time may be, for example, a distribution of a T1 relaxation time, a distribution of a T2 relaxation time and a distribution of a T2* relaxation time. Also a combination of these relaxation times may be used as material properties.

The processor may be configured to generate the simulated signal based on at least one of: a spatial distribution of a T1 relaxation time, a spatial distribution of a T2 relaxation time and a spatial distribution of a T2* relaxation time.

The spatial distribution of the electromagnetic field may comprise at least one of: a distribution of a transmit magnetic field ($B_1^+$), and a distribution of an off-resonance ($\Delta B_0$). These distributions may further help to improve the reconstruction.

The spatial distribution of the material property of the material of the sample may comprise a spatial distribution of a spectral content. This may help to improve the reconstruction and may provide important information. A spatial distribution of a spectral content may be used, for example, when the sample is made of different materials, each resonating at a different frequency. Then, the $\Delta B_0$ can be not only spatially dependent, but also material dependent. The sample can consist of different molecules in which the hydrogen nuclei that create the MRI signal, have different Larmor frequencies due to different chemical bondings.

The spatial parameter distributions may include each one of: a distribution of a T1 relaxation time, a distribution of a T2 or T2* relaxation time, a transmit magnetic field ($B_1^+$), and a distribution of an off-resonance ($\Delta B_0$). This may lead to improved reconstruction result.

The distribution of the magnetization may be based on a product $M_0 B_1^-$ of an equilibrium value $M_0$ of spin magnetization and a spatially varying receiving radio-frequency (RF) field $B_1^-$ of the receiving coil.

The processor may be configured to generate the simulated signal by solving a system of equations including Bloch equations and Faraday equations.

The system may comprise a gradient coil configured to apply a spatial encoding gradient and/or a readout gradient.

The excitation device, the gradient coil, and the receiving coil may be configured to perform a sequence of a plurality of acquisitions with different gradient encodings. This helps to improve a spatial resolution of the reconstructions.

The excitation device may be configured to employ an RF train in which a tip angle alternates between a plurality of different states. This may help to reduce the effect of noise on the reconstructed parameter maps. For example, the excitation device may be configured to employ an RF train in which a tip angle alternates between two different states.

The excitation device may be configured to perform a sequence of excitations wherein the sample is excited again before the sample can reach an equilibrium state. This helps to speed up the acquisitions.

Another aspect of the invention provides a method of performing time-domain magnetic resonance imaging, comprising transiently exciting a sample by a radio frequency, RF, excitation device, thereby causing the sample to emit an MRI signal, wherein a sequence of excitations is performed in which the sample is excited again before the sample can reach an equilibrium state;

receiving the MRI signal by a receiving coil;

generating a simulated signal of the receiving coil in a time domain, based on a plurality of spatial parameter distributions, wherein the spatial parameter distributions include a spatial distribution of a magnetization, wherein the spatial parameter distributions further include at least one of a spatial distribution of a material property of a material of the sample and a spatial distribution of an electromagnetic field;

determining an objective function based on a difference between the received MRI signal and the simulated signal in the time domain; and fitting the plurality of spatial parameter distributions based on the objective function.

Another aspect of the invention provides a computer program product comprising instructions for causing a processor to:

store an MRI signal received by a receiving coil, wherein the MRI signal is emitted by a sample that has been transiently excited with a radio frequency, RF, excitation device, wherein a sequence of excitations has been performed in which the sample was excited again before the sample could reach an equilibrium state;

generate a simulated signal of the receiving coil in a time domain, based on a plurality of spatial parameter distributions, wherein the spatial parameter distributions include a spatial distribution of a magnetization, wherein the spatial parameter distributions further include at least one of a spatial distribution of a material property of a material of the sample and a spatial distribution of an electromagnetic field;

determine an objective function based on a difference between the received MRI signal and the simulated signal in the time domain; and fit the plurality of spatial parameter distributions based on the objective function.

The person skilled in the art will understand that the features described above may be combined in any way deemed useful. Moreover, modifications and variations described in respect of the system may likewise be applied to the method and to the computer program product, and modifications and variations described in respect of the method may likewise be applied to the system and to the computer program product.

BRIEF DESCRIPTION OF THE DRAWINGS

In the following, aspects of the invention will be elucidated by means of examples, with reference to the drawings. The drawings are diagrammatic and may not be drawn to scale.

DETAILED DESCRIPTION OF EMBODIMENTS

In the following description, a number of example embodiments will be described in more detail. However, the description of these embodiments is not intended to limit the scope of protection. Also, examples of particular equations used in the iterative reconstruction process will be described in the following. However, it is noted that in view of the present disclosure, the techniques described in respect thereto may be applied in a similar way using alternative or modified mathematical models and techniques.

The Bloch equation is known to be as follows:

$$\frac{d}{dt}\begin{pmatrix} M_x \\ M_y \\ M_z \end{pmatrix} = \begin{pmatrix} -\frac{1}{T_2} & \gamma(\vec{G}\cdot\vec{r}+\Delta B_0) & -\gamma B_{1,y} \\ -\gamma(\vec{G}\cdot\vec{r}+\Delta B_0) & -\frac{1}{T_2} & \gamma B_{1,x} \\ \gamma B_{1,y} & -\gamma B_{1,x} & -\frac{1}{T_1} \end{pmatrix}\begin{pmatrix} M_x \\ M_y \\ M_z \end{pmatrix} + \begin{pmatrix} 0 \\ 0 \\ \frac{M_0}{T_1} \end{pmatrix}. \quad \text{(Equation 1)}$$

Herein, $\vec{M}(t, \vec{r}) \equiv (M_x(t, \vec{r}), M_y(t, \vec{r}), M_z(t, \vec{r}))^T$ is the spin magnetization, with $\vec{M}(0, \vec{r}) = (0, 0, M_0(\vec{r}))^T$ where $M_0(\vec{r})$ is the equilibrium value of the magnetization, which is assumed to be applicable at t=0. This equilibrium value $M_0(\vec{r})$ is directly proportional to the proton spin density;

$T_1(\vec{r})$ and $T_2(\vec{r})$ are tissue relaxation parameters;

$\Delta B_0(\vec{r})$ denotes the off-resonance;

$\vec{G}(t) = (G_x(t), G_y(t), G_z(t))^T$ denotes the applied gradient field;

γ is the gyromagnetic constant;

$B_{1,x}(t, \vec{r})$ denotes the real part of $B_1^+(\vec{r})RF(t)$;

$B_{1,y}(t, \vec{r})$ denotes the imaginary part of $B_1^+(\vec{r})RF(t)$;

RF(t) denotes the (complex-valued) excitation radio frequency waveform;

$B_1^+(\vec{r})$ denotes the spatially varying transmit magnetic field. For simplicity of exposition, $B_1^+(\vec{r})$ will be assumed to be real valued, although in practice $B_1^+(\vec{r})$ may be complex valued. The methods disclosed herein may be easily extended to the complex valued $B_1^+(\vec{r})$.

Derived from Faraday's law of induction after demodulation, the signal collected by the receiving coil of the MR scanner is given by:

$$s(a,\vec{b},t) = \int_r a(\vec{r}) M(\vec{r},\vec{b}(\vec{r}),t) d\vec{r}, t \in \tau \quad \text{(Equation 2)}.$$

Herein, $a(\vec{r})$ represents the product $M_0(\vec{r}) B_1^-(\vec{r})$;

$B_1^-(\vec{r})$ denotes the (complex valued) spatially varying receive RF field of the receiving coil.

M denotes the transverse magnetization, which has real part $M_x$ and imaginary part $M_y$;

$\tau$ denotes the acquisition interval.

The other parameters from Eq. (1) are included in Eq. (2) as a vector $\vec{b}(\vec{r}) = (T_1(\vec{r}), T_2(\vec{r}), B_1^+(\vec{r}), \Delta B_0(\vec{r}))$.

In an implementation example, the parameters to be estimated are $a(\vec{r})$ and $\vec{b}(\vec{r})$. These parameters may be estimated for all $\vec{r}$ over the whole volume V.

The collected demodulated data in time domain is denoted by d(t). The remaining parameters appearing in Eq. (1) and Eq. (2) can be considered to be known based on the settings and properties of the MRI apparatus.

Given the collected demodulated data in time domain, d(t), the reconstruction of (a, $\vec{b}$) is denoted by (a*, $\vec{b}$*). This reconstruction is generated by solving the nonlinear least squares problem $$(a^*, \vec{b}^*) = \underset{a,\vec{b}}{\operatorname{argmin}} \int_{t \in \tau} |d(t) - s(a,\vec{b},t)|^2 dt$$

such that Eq. (1) and Eq. (2) hold (Equation 3).

Because the cost function is directly connected to Eq. (1) and Eq. (2), direct reconstruction of the parameters (a, $\vec{b}$) is possible in time domain, without having to deal with the sequence design constraints dictated by the Fourier-transform.

The reconstruction problem acts directly on the signal in time domain. This is different from most existing MRI techniques, in which the reconstruction is based on assembling the k-space matrix and subsequently perform (variants of) Fast Fourier Transform. Furthermore, the quantitative values of the tissue parameters and applicable electromagnetic field are directly reconstructed.

Although in the present example, all of the parameters (a, $\vec{b}$)) are reconstructed, it will be understood that it is possible to reconstruct only a subset of these parameters. Moreover, some of the parameters may be replaced by other parameters by modifying the system equations, that is, Equations 1 and 2.

A numerical problem is obtained by discretizing Equation 3, as follows:

$$(a^*, b^*) = \underset{\vec{\theta}}{\operatorname{argmin}} \sum_{j=1}^{J} \left| d_j - \sum_{r=1}^{R} a_r M_{j,r}(\vec{b}_r) \Delta_r \right|^2 \Delta_t$$

such that Eq. (1) and Eq. (2) hold (Equation 4).

The indices j and r denote, respectively, time and space discretization.

J is the number of acquired data samples,

R is the number of spatial grid points to be reconstructed, $\Delta_r$ and $\Delta_t$ are, respectively, the space and time discretization intervals.

The vectors $a \in \mathbb{C}^R$ and $b \in \mathbb{R}^{4R}$ represent, respectively, the vertical concatenation of all a and $\vec{b}$ values in the spatial grid to be reconstructed. In particular, for r=1, ..., R:

$$\begin{cases} (T_1)_r = b_r \\ (T_2)_r = b_{r+R} \\ (B_1^+)_r = b_{r+2R} \\ (B_0)_r = b_{r+3R} \end{cases} \quad \text{(Equation 5)}$$

Using matrix-vector notation, Eq. (4) can be written as:

$$(a^*, b^*) = \underset{a,b}{\operatorname{argmin}} \|d - M(b)a\|_2^2. \quad \text{(Equation 6)}$$

Herein, the matrix M(b) is defined by $[M(b)]_{j,r} = \Delta_r M_{j,r}(\vec{b}_r)$. At this point, a mathematical distinction between a and b becomes apparent: the response of the system, M(b)a, is linearly dependent on a and nonlinearly dependent on b. The nonlinear least squares problem is thus separable.

Problems of the form given by Eq. (6) can be efficiently solved by the variable projection method (varpro), as disclosed in Gene H. Golub and V. Pereyra, "Separable nonlinear least squares: the variable projection method and its applications", Inverse Problems 19, R1-R26 (2003). The varpro makes use of the fact that, for a given b, Eq. (6) becomes a linear least squares problem, thereby the calculation of the Jacobian is simplified since $$\frac{dM(b)a}{da} = M(b).$$

In addition, solving Eq. (6) by varpro results in relatively fast convergence rate and relatively small chance to hit a local minimum. The largest computational burden for solving the reconstruction problem is given by the calculation of the derivatives with respect to the nonlinear variables, that is:

$$\frac{dM(b)a}{db} = \frac{dM(b)}{db} a.$$

In the following, a method will be disclosed of efficiently calculating the derivatives $$\frac{dM(b)}{db}.$$

First of all, note that M(b) is given by the numerical solution of the Bloch equation (refer to Eq. (1)) for each voxel and each time point. In particular, the values at time index j and spatial location r are stored in $[M(b)]_{j,r}$. In the following, a calculation of the full matrix M is called a full Bloch simulation. The matrix of derivatives $$\frac{dM(b)}{db}$$

is given by $$\left[\frac{dMa}{db}\right]_{j,n} = \frac{\partial M_j a}{\partial b_n} = \frac{\partial \sum_{r=1}^{R}[M]_{j,r}a_r}{\partial b_n} = \quad \text{(Equation 7)}$$

$$\sum_{r=1}^{R}\frac{\partial[M]_{j,r}a_r}{\partial b_n} = \begin{cases} \frac{d[M]_{j,r}a_r}{db_n} & \text{if } n = r + hR, \\ & h \in \{0, 1, 2, 3\}. \\ 0 & \text{otherwise} \end{cases}$$

Herein, $M_j$ denotes the j-th row of M. Moreover, the fact is used that since $[M(b)]_{j,r}$ refers to the magnetization of the r-th voxel, $[M(b)]_{j,r}$ only depends on the values of $T_1$, $T_2$, $B_1^+$, $\Delta B_0$ of that specific voxel. That is, using Eq. (5), $\vec{b}_r = (T_1, T_2, B_1^+, \Delta B_0)_r = (b_r, b_{r+R}, b_{r+2R}, b_{r+3R})$.

To compute $$\frac{d[M(b)]_{j,r}}{db_n},$$

a finite difference scheme can be used, for example:

$$\frac{d[M]_{j,r}}{db_n} \approx \quad \text{(Equation 8)}$$

$$\begin{cases} \frac{M_j((T_1 + \Delta^I, T_2, B_1^+, B_0)_r) - M_j((T_1, T_2, B_1^+, B_0)_r)}{\Delta^I} & \text{if } n = r \\ \frac{M_j((T_1, T_2 + \Delta^{II}, B_1^+, B_0)_r) - M_j((T_1, T_2, B_1^+, B_0)_r)}{\Delta^{II}} & \text{if } n = r + R \\ \frac{M_j((T_1, T_2, B_1^+ + \Delta^{III}, B_0)_r) - M_j((T_1, T_2, B_1^+, B_0)_r)}{\Delta^{III}} & \text{if } n = r + 2R \\ \frac{M_j((T_1, T_2, B_1^+, B_0 + \Delta^{IV})_r) - M_j((T_1, T_2, B_1^+, B_0)_r)}{\Delta^{IV}} & \text{if } n = r + 3R \end{cases}$$

Herein, the differences $\Delta^I$, $\Delta^{II}$, $\Delta^{III}$, and $\Delta^{IV}$ may be selected according to needed accuracy, they should be selected small enough for an accurate estimation of the derivative. It is noted that to compute these partial derivatives, only four extra full Bloch simulations are needed, in addition to the already known $[M(b)]_{j,r} = M_j((T_1, T_2, B_1^+, \Delta B_0)_r)$.

The optimization problem of Eq. (6) could be ill-conditioned, that is: small perturbations (e.g. measurement noise) in the data might be amplified in the reconstructed parameter. To reduce the effect of the noise in the reconstructed images, it is better that the expected standard deviation of the reconstructed parameters is small. This can be estimated by first computing the variance-covariance matrix C, which is defined as $C = \sigma^2(D^T D)^{-1}$, wherein $\sigma$ is the standard deviation of the noise, and wherein D is defined as $$D = \begin{bmatrix} \frac{dM(b)a}{da} \\ \frac{dM(b)a}{db} \end{bmatrix}. \quad \text{(Equation 9)}$$

The estimated standard deviation of the n-th parameter is $\sigma_n \approx \sqrt{C_{n,n}}$. Clearly, the values of $\sigma_n$ for $n=1, \ldots, 6R$ should be as small as possible.

The type of measurement sequence at least partially determines $\sigma_n$. In preliminary tests, fully balanced 2D gradient echo sequences were employed. By means of simulation, $\sigma_n$ were computed and the sequence parameters were adjusted until $\sigma_n$ would be small enough. It was found that, by employing an RF train wherein the tip angle alternates between two different states, the resulting $\sigma_n$ is small enough to reconstruct accurately the parameter maps. For example, this was the case when 10 full k-space acquisitions are subsequently performed (see FIG. 3). For example, the tip angle may alternate between 0 and a fixed value a (see FIG. 1).

Figure 1:
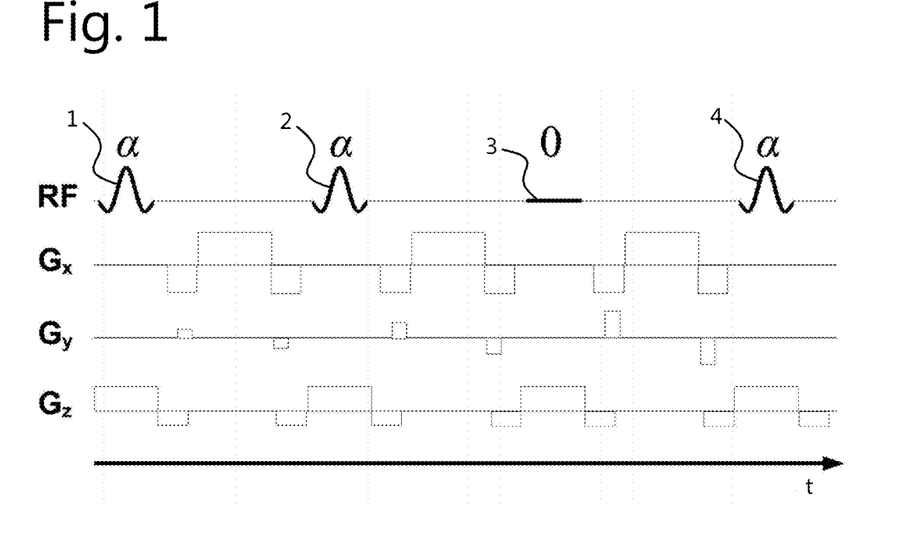
FIG. 1 shows a fragment of an acquisition sequence.

FIG. 1 shows a fragment of the sequence that was used to acquire the data in the experiments. The spatially selective RF pulse is scaled by the tip angle α for the excitations 1, 2, and 4, and it is OFF for excitation 3. $G_x$ and $G_y$ are encoding gradients. $G_z$ is the slice selective gradient. Note that the sequential RF and gradient events follow each other without waiting times.

Figure 2:
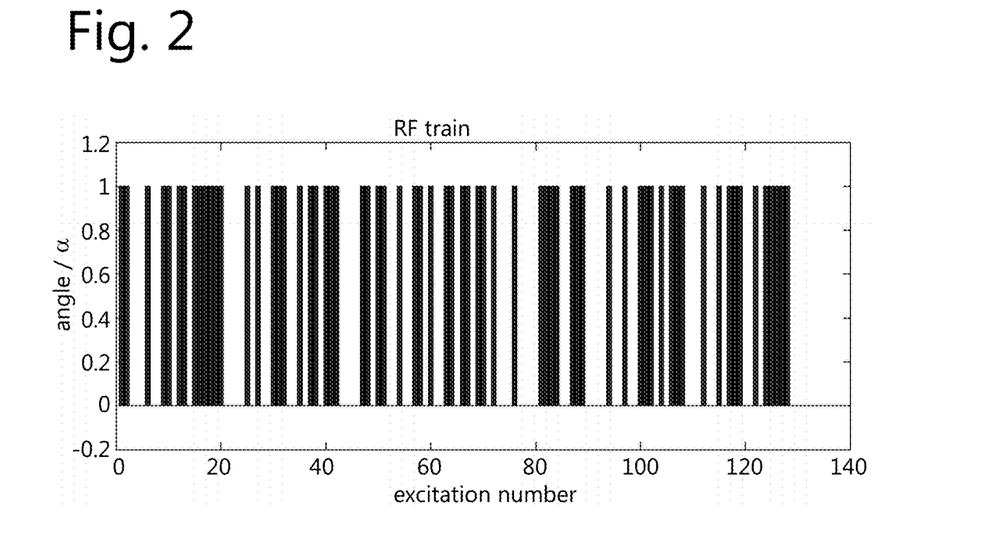
FIG. 2 shows a fragment of an RF tip-angles train.

FIG. 2 shows a fragment of the RF train used in the experiments. In this example, the tip angle (i.e., the scaling of RF excitation) alternates between 0 and α.

Figure 3:
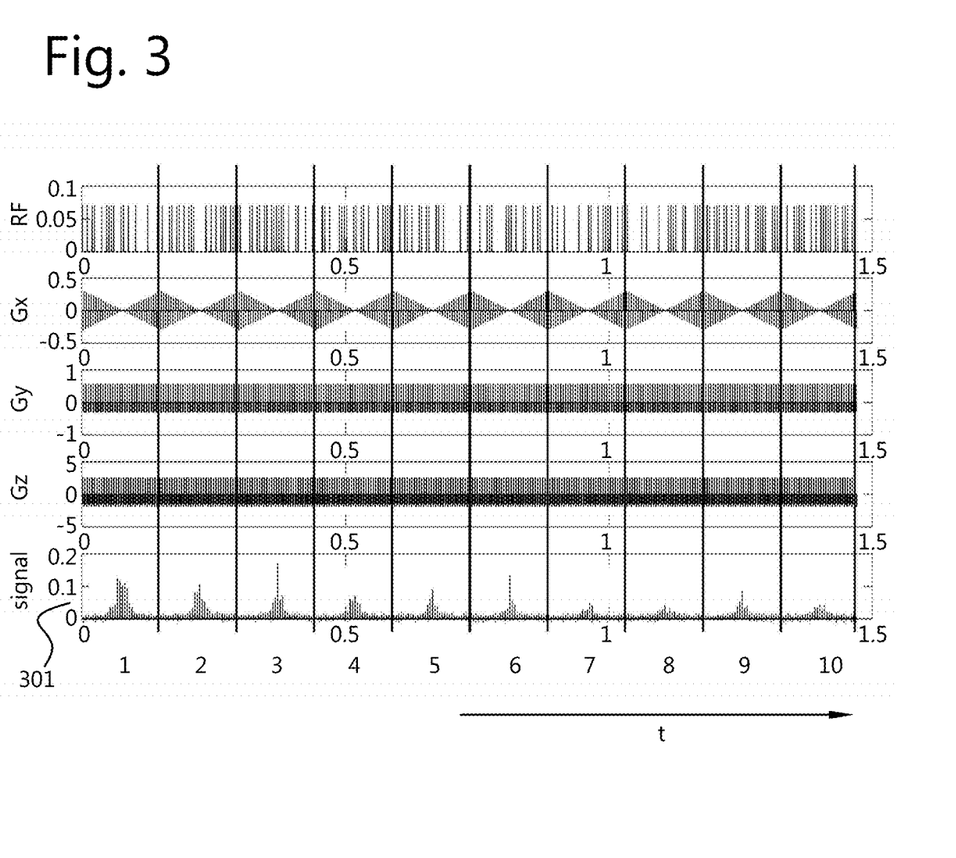
FIG. 3 shows a complete sequence and a corresponding measured signal.

FIG. 3 shows a complete sequence and a corresponding measured signal 301. The vertical lines subdivide the total acquisition interval into single full k-space acquisitions, denoted by the numbers below the graph.

In the above examples, all of the parameters of $a_r$ and $\vec{b}_r = (T_1, T_2, B_1^+, \Delta B_0)_r$ are reconstructed. In an alternative implementation, only a subset of these parameters are reconstructed. In this case, the above approach may be altered as follows: Consider the parameters that do not need to be estimated as known constants. Then the variables a and/or $\vec{b}$ contain less unknowns, but the mathematical/computational procedure may remain formally unaltered. Furthermore, it is possible to design experiments (sequences) which are insensitive to the parameters which are not needed. In this case, the fitting can be performed only on the desired parameters, since the signal depends only on them.

Figure 4:
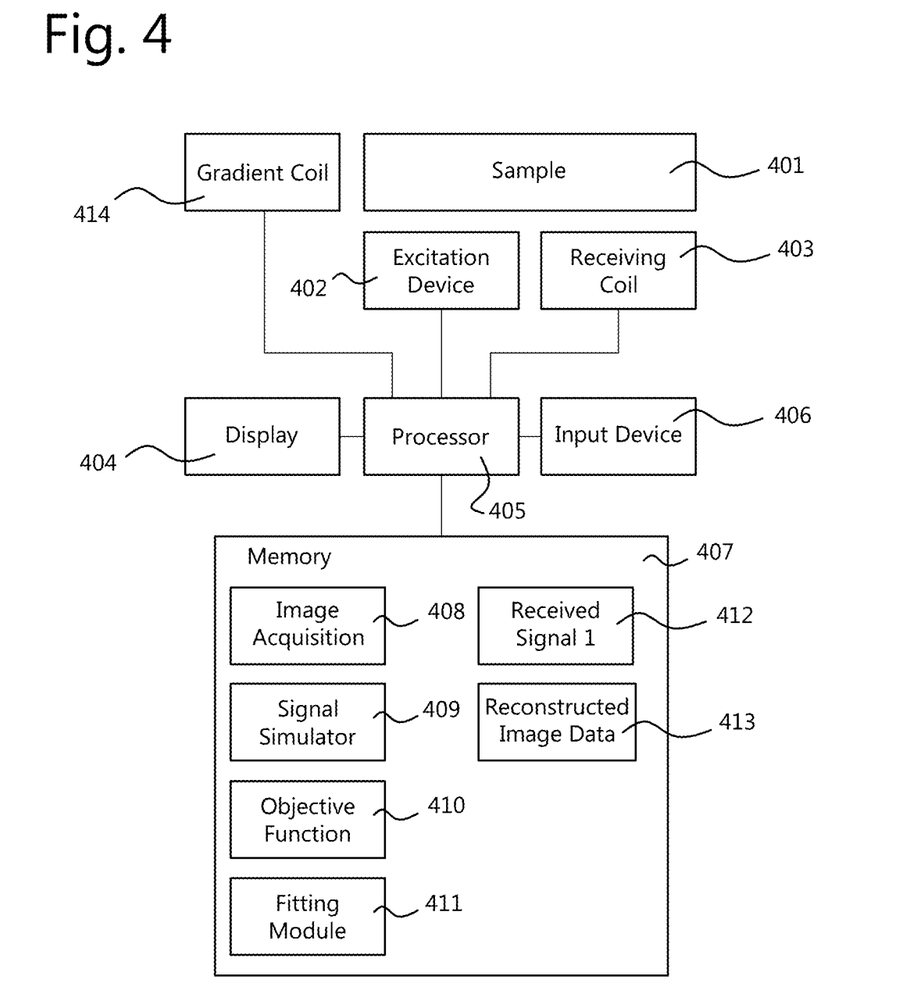
FIG. 4 is a block diagram of a system for performing time-domain magnetic resonance imaging.

FIG. 4 illustrates components of a system for performing time-domain magnetic resonance imaging of a sample 401. The sample 401 itself is not part of the system. Generally the system comprises an excitation device 402 for transiently exciting the sample 401, thereby causing the sample 401 to emit an emitting signal. The system further comprises a receiving coil 403 for receiving the emitting signal. The excitation device 402 and the receiving coil 403 are well known in the field of MRI, and are not described herein in greater detail. The system further comprises a processor 405 which controls the components of the system including the excitation device 402 and the receiving coil 403. The processor 405 may further control a display 404 for outputting images and/or status information, and an input device 406, such as a touch screen, mouse, and keyboard, for receiving commands and auxiliary information from a user. The processor 405 may comprise a plurality of processing devices that are configured to cooperate to perform a task such as a computation. Alternatively, the processor 405 consists of a single processing device. Such processing devices, such as central processing unit (CPU), controller, or FPGA, are known in the art. Some well-known elements of MRI devices have been omitted in the drawing and this description in order not to obscure the description.

The system further comprises a storage means, such as a memory 407. The memory 407 may be configured to store, under control of the processor 405, signals 412 received from the receiving coil 403 and/or reconstructed image data 413. The reconstructed image data 413 may be generated by the system by processing the received signals 412. The memory 407 may further store computer code to cause the processor 405 to perform its tasks. For example, the computer code may include an image acquisition module 408 for operating a data acquisition based on an acquisition scheme such as illustrated in FIG. 1. That image acquisition module 408 may cause the excitation device 402 to transiently excite the sample 401 thereby causing the sample to emit an emitting signal. Further, the image acquisition module 408 may cause the processor 405 to receive and store the emitting signal from the receiving coil 403 which receives the signal emitted by the sample 401.

Moreover, the memory 407 may store a signal simulator module 409 configured to generate a simulated signal of the receiving coil in a time domain, based on a plurality of spatial parameter distributions. Herein, a spatial parameter distribution is a parameter which varies across the space. For example such a parameter is different for different portions of the sample 401. The spatial distribution comprises the values of the parameter for different spatial locations. The spatial parameter distributions on which the simulation is based may include a spatial distribution of a magnetization, that is, a state of the spins of the relevant nuclei at each location. The spatial parameter distributions on which the simulation is based may also include a spatial distribution of a material property of a material of the sample. For example, this material property may be different for different materials, for example different tissue types of an organism. The spatial parameter distributions on which the simulation is based may also include a spatial distribution of an electromagnetic field. Such an electromagnetic field describes at least an aspect of an electromagnetic environment in which the sample exists. At a macroscopic level, an electromagnetic field has an effect on the magnetization, but the magnetization does not have an effect on the electromagnetic field. In fact, the magnetization represents the state of the spins and it is determined by the electromagnetic fields (i.e. B1+, B0 and RF).

The memory may further store an objective function calculating module 410. This module calculates an objective function based on a difference between the received emitting signal and the simulated signal in the time domain. Note, that the received emitting signal may be subjected to some processing such as demodulation, digitization, filtering, and/or noise reduction before the objective function is applied to it. However, the received emitting signal remains in the time domain.

The memory may further store a fitting module 411. The fitting module 411 fits the plurality of spatial parameter distributions based on the objective function. The fitting may be realized in an iterative fashion. The spatial parameter distributions may be adjusted and the objective function may be re-calculated by the objective function module 410, until the outcome of the objective function satisfies a predetermined termination criterion.

In particular implementations, the material property may comprise a relaxation time, such as a T1 relaxation time, a T2 relaxation time or a spatial distribution of a T2* relaxation time. These may also be combined, for example spatial distributions of both T1 and T2 relaxation time may be employed, or T1 and T2*. Alternatively, all three relaxation times are used. Alternatively, one of the relaxation times may be replaced by another relaxation time not mentioned in this document. Alternatively or additionally, a spatial distribution of a spectral content of the material may be used as a spatial distribution of a material property.

The spatial distribution of the electromagnetic field may comprise at least one of: a distribution of a transmit magnetic field ($B_1^+$), and a distribution of an off-resonance ($\Delta B_0$), or both. As described hereinabove, said spatial parameter distributions can include the combination of a distribution of a T1 relaxation time, a distribution of a T2 (or T2*) relaxation time, a transmit magnetic field ($B_1^+$), and a distribution of an off-resonance ($\Delta B_0$).

The distribution of the magnetization may be based on, or equal to, a product $M_0 B_1^-$ of an equilibrium value $M_0$ of spin magnetization and a spatially varying radio-frequency (RF) field $B_1^-$ of the receiving coil.

The signal simulator 409 may be configured to generate the simulated signal by solving a system of equations including Bloch equations and Faraday equations.

As illustrated in FIG. 1, the system may further comprise a gradient coil 414 configured to apply, under control of the processor 405 and the image acquisition module 408, a spatial encoding gradient and/or a readout gradient as part of the acquisition sequence.

The image acquisition module 408 may cause the excitation device 402, the gradient coil 414, and the receiving coil 403 to perform a sequence of a plurality of acquisitions with different gradient encodings. The signals collected in the plurality of acquisitions may be combined in the reconstruction. The signal simulator 409 may be configured to simulate each of the plurality of acquisitions, and the objective function module 410 may calculate a combined objective value based on the collected received signals and the corresponding simulated signals.

The image acquisition module 408 may cause the excitation device 402, during acquisition, to employ an RF train in which a tip angle alternates between two different states. This may be an on state and an off state.

The image acquisition module 408 may carry out an acquisition sequence in which the excitation device is configured to perform a sequence of excitations wherein the sample is excited again before the sample can reach an equilibrium state.

Although the above description relates to an implementation using software, it is also possible to implement the techniques described herein fully in hardware, for example employing a dedicated electronic circuit to replace the software components described hereinabove.

Figure 5:
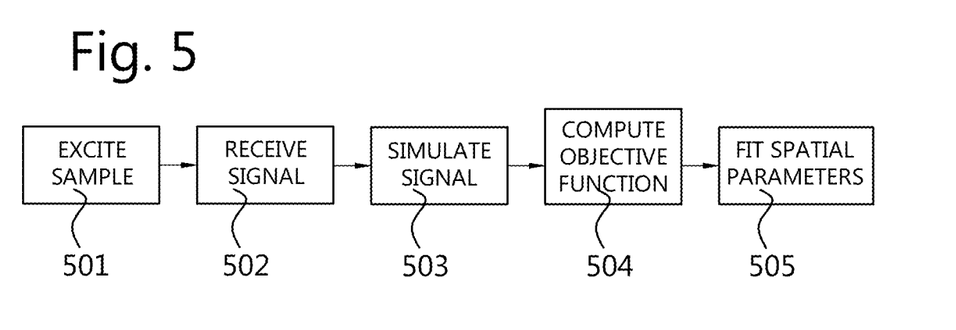
FIG. 5 is a flowchart of a method of performing time-domain magnetic resonance imaging.

FIG. 5 shows a flow chart of a method of performing time-domain magnetic resonance imaging. In step 501, a sample is transiently excited by an excitation device, thereby causing the sample to emit an emitting signal. In step 502, the emitting signal is received by a receiving coil. In step 503, a simulated signal of the receiving coil is simulated in a time domain, based on a plurality of spatial parameter distributions, wherein the spatial parameter distributions include a spatial distribution of a magnetization, wherein the spatial parameter distributions further include at least one of a spatial distribution of a material property of a material of the sample and a spatial distribution of an electromagnetic field. In step 504, an objective function is determined based on a difference between the received emitting signal and the simulated signal in the time domain. In step 505, the plurality of spatial parameter distributions is fitted based on the objective function. The fitting step includes searching for spatial parameter distributions for which the simulated signal is most similar to the received signal according to the objective function. As part of the fitting step 505, the steps 503, 504 may be repeated for different values of the spatial parameter distributions to find a spatial parameter distribution satisfying certain criteria regarding the outcome of the objective function. At least steps 503, 504, and 505 may be implemented by means of software code for the iterative algorithm.

Regarding spectral content, the MR dynamics are dependent on the molecular environment in which the nucleus finds itself. If a chemical compound is present whose resonance frequency is different than the hydrogen Larmor frequency, the Bloch equation may be modified. In particular, suppose that fat molecules are present. Then, the Bloch equation for the fat compound can be expressed as $$\frac{d}{dt}\begin{pmatrix} M_x^f \\ M_y^f \\ M_z^f \end{pmatrix} =$$

$$\begin{pmatrix} -\frac{1}{T_2^f} & \gamma(1-\sigma^f)(\vec{G}\cdot\vec{r}+\Delta B_0) & -\gamma B_{1,y} \\ -\gamma(1-\sigma^f)\gamma(\vec{G}\cdot\vec{r}+\Delta B_0) & -\frac{1}{T_2^f} & \gamma B_{1,x} \\ \gamma B_{1,y} & -\gamma B_{1,x} & -\frac{1}{T_1^f} \end{pmatrix}\begin{pmatrix} M_x^f \\ M_y^f \\ M_z^f \end{pmatrix} + \begin{pmatrix} 0 \\ 0 \\ \frac{M_0^f}{T_1^f} \end{pmatrix},$$

wherein $\sigma^f$, $T_1^f$, and $T_2^f$ denote, respectively, the so-called chemical shift, transverse and longitudinal decay times of the fat compound.

The signal can be obtained by summing the transverse magnetization of both component (water, M, and fat, $M^f$):

$$s(a,\vec{b},a^f,\vec{b}^f,t) = \int_V [a(\vec{r})M(\vec{r},\vec{b}(\vec{r}),t) + a(\vec{r})^f M^f(\vec{r},\vec{b}^f(\vec{r}),t)]d\vec{r}, t \in \tau$$

By setting $a^{\mathit{eff}}=(a, a^f)$ and $\vec{b}^{\mathit{eff}}=(\vec{b}, \vec{b}^f)$, the problem can be solved in an analogous way as the single chemical component case.

The following clauses define aspects of the present disclosure.

Clause 1. A system for performing time-domain magnetic resonance imaging, comprising
an excitation device for transiently exciting a sample thereby causing the sample to emit an emitting signal;
a receiving coil for receiving the emitting signal; and
a processor configured to:
generate a simulated signal of the receiving coil in a time domain, based on a plurality of spatial parameter distributions, wherein the spatial parameter distributions include a spatial distribution of a magnetization, wherein the spatial parameter distributions further include at least one of a spatial distribution of a material property of a material of the sample and a spatial distribution of an electromagnetic field;
determine an objective function based on a difference between the received emitting signal and the simulated signal in the time domain; and
fit the plurality of spatial parameter distributions based on the objective function.

Clause 2. The system of clause 1, wherein the material property comprises a property of a tissue of an organism.

Clause 3. The system of clause 1, wherein material property comprises a relaxation time.

Clause 4. The system of clause 3, wherein the spatial parameter distribution of the material property comprises at least one of: a spatial distribution of a T1 relaxation time, a spatial distribution of a T2 relaxation time and a spatial distribution of a T2* relaxation time.

Clause 5. The system of clause 1, wherein the spatial distribution of the electromagnetic field comprises at least one of: a distribution of a transmit magnetic field ($B_1^+$), and a distribution of an off-resonance ($\Delta B_0$).

Clause 6. The system of clause 1, wherein said spatial distribution of the material property of the material of the sample comprises a spatial distribution of a spectral content.

Clause 7. The system of clause 4, wherein said spatial parameter distributions include each one of: a distribution of a T1 relaxation time, a distribution of a T2 or T2* relaxation time, a transmit magnetic field ($B_1^+$), and a distribution of an off-resonance ($\Delta B_0$).

Clause 8. The system of clause 1, wherein the distribution of the magnetization is based on a product $M_0 B_1^-$ of an equilibrium value $M_0$ of spin magnetization and a spatially varying receiving radio-frequency (RF) field $B_1^-$ of the receiving coil.

Clause 9. The system of clause 1, wherein the processor is configured to generate the simulated signal by solving a system of equations including Bloch equations and Faraday equations.

Clause 10. The system of clause 1, further comprising a gradient coil configured to apply spatial encoding gradients.

Clause 11. The system according to clause 10, wherein the excitation device, the gradient coil, and the receiving coil are configured to perform a sequence of a plurality of acquisitions with different gradient encodings.

Clause 12. The system of clause 1, wherein the excitation device is configured to employ an RF train in which a tip angle alternates between a plurality of different states.

Clause 13. The system of clause 1, wherein the excitation device is configured to perform a sequence of excitations wherein the sample is excited again before the sample can reach an equilibrium state.

Clause 14. A method of performing time-domain magnetic resonance imaging, comprising
transiently exciting a sample by an excitation device, thereby causing the sample to emit an emitting signal;
receiving the emitting signal by a receiving coil;
generating a simulated signal of the receiving coil in a time domain, based on a plurality of spatial parameter distributions, wherein the spatial parameter distributions include a spatial distribution of a magnetization, wherein the spatial parameter distributions further include at least one of a spatial distribution of a material property of a material of the sample and a spatial distribution of an electromagnetic field;
determining an objective function based on a difference between the received emitting signal and the simulated signal in the time domain; and
fitting the plurality of spatial parameter distributions based on the objective function.

Clause 15. A computer program product comprising instructions for causing a processor to:
store an emitting signal received by a receiving coil, wherein the emitting signal is emitted by a sample that has been transiently excited with an excitation device;

generate a simulated signal of the receiving coil in a time domain, based on a plurality of spatial parameter distributions, wherein the spatial parameter distributions include a spatial distribution of a magnetization, wherein the spatial parameter distributions further include at least one of a spatial distribution of a material property of a material of the sample and a spatial distribution of an electromagnetic field;

determine an objective function based on a difference between the received emitting signal and the simulated signal in the time domain; and fit the plurality of spatial parameter distributions based on the objective function.

Some or all aspects of the invention may be suitable for being implemented in form of software, in particular a computer program product. Such computer program product may comprise a storage media, such as a memory, on which the software is stored. Also, the computer program may be represented by a signal, such as an optic signal or an electro-magnetic signal, carried by a transmission medium such as an optic fiber cable or the air. The computer program may partly or entirely have the form of source code, object code, or pseudo code, suitable for being executed by a computer system. For example, the code may be executable by one or more processors.

The examples and embodiments described herein serve to illustrate rather than limit the invention. The person skilled in the art will be able to design alternative embodiments without departing from the scope of the claims. Reference signs placed in parentheses in the claims shall not be interpreted to limit the scope of the claims. Items described as separate entities in the claims or the description may be implemented as a single hardware or software item combining the features of the items described.

The invention claimed is:

1. A system for performing time-domain magnetic resonance imaging, comprising:
    a radio frequency, RF, excitation device for transiently exciting a sample thereby causing the sample to emit an MRI signal, wherein the excitation device is configured to perform a sequence of excitations wherein the sample is excited again before the sample reaches an equilibrium state;
    a receiving coil for receiving the MRI signal; and
    a processor configured to:
    generate a simulated signal of the receiving coil in a time domain, based on a plurality of spatial parameter distributions, wherein the spatial parameter distributions include a spatial distribution of a magnetization, wherein the spatial parameter distributions further include at least one of a spatial distribution of a material property of a material of the sample and a spatial distribution of an electromagnetic field;
    determine an objective function based on a difference between the received MRI signal and the simulated signal in the time domain; and
    fit the plurality of spatial parameter distributions based on the objective function.

2. The system of claim 1, wherein the material property comprises a property of a tissue of an organism.

3. The system of claim 1, wherein material property comprises a relaxation time.

4. The system of claim 3, wherein the spatial parameter distribution of the material property comprises at least one of: a spatial distribution of a T1 relaxation time, a spatial distribution of a T2 relaxation time and a spatial distribution of a T2* relaxation time.

5. The system of claim 1, wherein the spatial distribution of the electromagnetic field comprises at least one of: a distribution of a transmit magnetic field ($B_1^+$), and a distribution of an off-resonance ($\Delta B_0$).

6. The system of claim 1, wherein said spatial distribution of the material property of the material of the sample comprises a spatial distribution of a spectral content.

7. The system of claim 4, wherein said spatial parameter distributions include each one of: a distribution of a T1 relaxation time, a distribution of a T2 or T2* relaxation time, a transmit magnetic field ($B_1^+$), and a distribution of an off-resonance ($\Delta B_0$).

8. The system of claim 1, wherein the distribution of the magnetization is based on a product $M_0 B_1^-$ of an equilibrium value $M_0$ of spin magnetization and a spatially varying receiving radio-frequency (RF) field $B_1^-$ of the receiving coil.

9. The system of claim 1, wherein the processor is configured to generate the simulated signal by solving a system of equations including Bloch equations and Faraday equations.

10. The system of claim 1, further comprising a gradient coil configured to apply spatial encoding gradients.

11. The system according to claim 10, wherein the excitation device, the gradient coil, and the receiving coil are configured to perform a sequence of a plurality of acquisitions with different gradient encodings.

12. The system of claim 1, wherein the excitation device is configured to employ an RF train in which a tip angle alternates between a plurality of different states.

13. A method of performing time-domain magnetic resonance imaging, comprising:
    transiently exciting a sample by a radio frequency, RF, excitation device, thereby causing the sample to emit an MRI signal, wherein a sequence of excitations is performed in which the sample is excited again before the sample reaches an equilibrium state;
    receiving the MRI signal by a receiving coil;
    generating a simulated signal of the receiving coil in a time domain, based on a plurality of spatial parameter distributions, wherein the spatial parameter distributions include a spatial distribution of a magnetization, wherein the spatial parameter distributions further include at least one of a spatial distribution of a material property of a material of the sample and a spatial distribution of an electromagnetic field;
    determining an objective function based on a difference between the received MRI signal and the simulated signal in the time domain; and
    fitting the plurality of spatial parameter distributions based on the objective function.

14. A non-transitory computer-readable storage medium encoded with programming instructions, said programming instructions for causing a processor to:
    store an MRI signal received by a receiving coil, wherein the MRI signal is emitted by a sample that has been transiently excited with a radio frequency, RF, excitation device, wherein a sequence of excitations has been performed in which the sample was excited again before the sample was able to reach an equilibrium state;
    generate a simulated signal of the receiving coil in a time domain, based on a plurality of spatial parameter distributions, wherein the spatial parameter distributions include a spatial distribution of a magnetization, wherein the spatial parameter distributions further include at least one of a spatial distribution of a material property of a material of the sample and a spatial distribution of an electromagnetic field;

determine an objective function based on a difference between the received MRI signal and the simulated signal in the time domain; and fit the plurality of spatial parameter distributions based on the objective function.

* * * * *